United States Patent
Chao et al.

(10) Patent No.: US 6,291,030 B1
(45) Date of Patent: *Sep. 18, 2001

(54) METHOD FOR REDUCING CAPACITANCE IN METAL LINES USING AIR GAPS

(75) Inventors: Chung-Pei Chao; Cheng-Che Lee, both of Hsinchu (TW)

(73) Assignee: ProMOS Technologies, Inc., Hsinchu (TW)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/468,720

(22) Filed: Dec. 21, 1999

(51) Int. Cl.[7] .............................. H05H 1/24; H01L 21/00
(52) U.S. Cl. ...................... 427/579; 427/574; 427/569; 438/763; 438/788
(58) Field of Search .................... 427/575, 579, 427/574, 569; 438/763, 788, 789, 792

(56) References Cited

U.S. PATENT DOCUMENTS

| | | | |
|---|---|---|---|
| 4,721,553 | * | 1/1988 | Saito et al. ................ 204/192.12 |
| 4,868,617 | * | 9/1989 | Chiao .............................. 357/23.3 |
| 4,954,459 | * | 9/1990 | Avanzino et al. ................ 437/228 |
| 5,279,865 | * | 1/1994 | Chebi et al. ........................ 427/575 |
| 5,571,571 | * | 11/1996 | Musaka et al. .................... 427/575 |
| 5,593,741 | * | 1/1997 | Ikeda .................................. 427/575 |
| 5,726,412 | * | 3/1998 | Brifford et al. ............... 219/121.43 |
| 5,728,631 | * | 3/1998 | Wang ................................. 438/787 |
| 5,949,143 | * | 9/1999 | Bang ................................. 257/758 |
| 6,022,802 | | 2/2000 | Jang . |
| 6,054,381 | * | 4/2000 | Okada ............................... 438/624 |
| 6,077,767 | * | 6/2000 | Hwang .............................. 438/619 |
| 6,162,723 | * | 12/2000 | Tanaka .............................. 438/788 |
| 6,165,897 | * | 12/2000 | Jang ................................... 438/763 |
| 6,239,016 | * | 5/2001 | Ishikawa .......................... 438/763 |

* cited by examiner

*Primary Examiner*—Marianne Padgett
(74) *Attorney, Agent, or Firm*—Blakely Sokoloff Taylor & Zafman, LLP

(57) ABSTRACT

A method for forming a metal interconnect having a plurality of metal lines and an interlayer dielectric is disclosed. The metal interconnect has a decreased capacitance between the metal lines of the metal interconnect. First, a metal interconnect is formed onto a substrate. A first HDPCVD oxide layer is formed over the metal interconnect. A second HDPCVD oxide layer is formed over the first HDPCVD oxide layer, the second HDPCVD oxide layer being formed such that air gaps are formed between the metal lines of the metal interconnect. Furthermore, a third HDPCVD oxide layer may be formed over the second HDPCVD oxide layer, the third HDPCVD oxide formed using a sputter to deposition ratio higher than that used to form the second HDPCVD oxide layer.

4 Claims, 3 Drawing Sheets

METHOD FOR REDUCING CAPACITANCE IN METAL LINES USING AIR GAPS

BACKGROUND OF THE INVENTION

1. Field of the Invention

The present invention relates to metal interconnects, and more particularly, to a method for reducing capacitance between the lines of a metal interconnect.

2. Background Information

In semiconductor integrated circuit (IC) fabrication, metal lines are deposited to interconnect IC components and to connect IC components to pads. The metal lines are formed by the physical deposition (such as by sputtering) of a layer of metal (such as aluminum or an aluminum-copper alloy). The metal layer is then patterned and etched to form the desired interconnect pattern.

The "metal layer" is also referred to as a metal interconnect. Once the metal interconnect has been deposited and etched, a dielectric layer, commonly known as an interlayer dielectric (ILD), is deposited over the metal layer to insulate the metal layer from subsequently deposited conductive structures or layers.

FIG. 1 shows a typical prior art process of forming the interlayer dielectric over the metal interconnect structure. Specifically, in FIG. 1, a metal interconnect 101 is formed atop of a substrate 103. The term substrate as used herein refers to not only a semiconductor substrate, but may also refer to any intermediate structures, conductive layers, dielectric layers, or any other semiconductor structure that is underneath the metal layer 101.

Typically, in the prior art, a high-density plasma chemical vapor deposition (HDPCVD) oxide 105 is formed over the metal lines 101. Characteristically, the HDPCVD oxide 105 forms peaks over the metal lines. Next, a cap oxide layer 107 is formed over the HDPCVD oxide 105. The cap oxide layer 107 is formed by plasma enhanced chemical vapor deposition (PECVD). Turning to FIG. 2, after the cap oxide layer 107 is deposited, a planarization step, typically by chemical mechanical planarization (CMP), is used to planarize the cap oxide layer 107.

As the dimensions of integrated circuits decrease down to 0.15 microns and below, capacitance that is formed between adjacent metal lines 101 and between a metal line and the underlying substrate can be a performance limiting factor. Specifically, turning to FIG. 3, the conductive structures are shown in schematic form with the metal lines identified by reference numeral 101. The center metal line 101b creates a capacitance with its two neighboring adjacent metal lines 101a and 101c. In addition, the center metal line 101b creates a capacitance with any conductive structures in the substrate.

As can be appreciated by those skilled in the art, the capacitance is directly related to the distance between the conductive structures. As this distance becomes smaller, the capacitance increases. This capacitance tends to slow or impede the flow of signals along the metal lines due to the RC delay.

The most popular material used for ILD comprises silicon dioxide, which has a dielectric constant of about 3.9. One prior art method to reduce capacitance is to utilize low-k dielectrics, such as a fluorine-doped oxide. However, this technology is not well developed and may cause other problems in the manufacturing process.

Further, it has been contemplated to form air gaps between the metal lines. Because air has the lowest dielectric constant of 1, this will lower the capacitance between metal lines if air gaps are inserted between the metal lines. The conventional air gap structure is formed by depositing a layer of plasma enhanced chemical vapor deposition (PECVD) silicon dioxide to form the air gaps, followed by a high density plasma chemical vapor deposition (HDPCVD) silicon dioxide process. Finally, a cap oxide layer is deposited and a chemical mechanical polishing (CMP) is performed. However, the CMP process will cause problems with the ILD structure if performed incorrectly.

Thus, what is needed is a new method to produce air gaps between metal lines to reduce the capacitance between metal lines for very narrow distances between the metal lines.

SUMMARY OF THE INVENTION

A method for forming a metal interconnect having a plurality of metal lines and an interlayer dielectric is disclosed. The metal interconnect has a decreased capacitance between the metal lines of the metal interconnect. First, a metal interconnect is formed onto a substrate. A first HDPCVD oxide layer is formed over the metal interconnect. A second HDPCVD oxide layer is formed over the first HDPCVD oxide layer, the second HDPCVD oxide layer being formed such that air gaps are formed between the metal lines of the metal interconnect. Furthermore, a third HDPCVD oxide layer may be formed over the second HDPCVD oxide layer, the third HDPCVD oxide formed using a sputter to deposition ratio higher than that used to form the second HDPCVD oxide layer.

BRIEF DESCRIPTION OF DRAWINGS

The present invention will be described in conjunction with the attached Figures, wherein.

DETAILED DESCRIPTION OF THE INVENTION

The present invention uses a multi-step HDPCVD oxide process to form air gaps between adjacent metal lines. The first HDPCVD oxide deposition step uses a high sputter to deposition ratio. The second HDPCVD oxide deposition step uses a low sputter to deposition ratio. Finally, the third HDPCVD oxide deposition step uses a high sputter to deposition ratio. The second deposition forms a HDPCVD oxide layer that has air gaps between the metal lines, but provides poor step coverage. The third HDPCVD oxide deposition step using the high sputter to deposition ratio acts to partially fill the gaps and planarize the first step of forming the oxide.

The formation of HDPCVD oxide is accomplished by a combination of deposition and sputtering. The most widely used apparatus for the formation of HDPCVD oxide is manufactured by Applied Materials and is referred to as the Ultima model. Other HDPCVD machines are the Model 2000 manufactured by Watkins-Johnson and the Model Speed manufactured by Novellus Corp.

The deposition process of the HDPCVD machines results from a low frequency RF power source that drives silicon (from silane) and oxygen ions towards the surface of the wafer to form a silicon oxide (SiO$_2$). The sputtering process of the HDPCVD machines results from a high frequency bias power that drives inert gas ions (typically Argon) towards the surface of the wafer. As can be appreciated by those skilled in the art, sputtering in the HDPCVD oxide art refers to the process of bombarding deposited oxide with inert gas ions in order to dislodge oxide particles. Thus, the deposition process forms oxide on the wafer and the sputtering process dislodges and rearranges the deposited oxide on the wafer.

By varying the sputter to deposition ratio (S/D), different gap filling properties may be achieved. A high S/D ratio results in very good gap filling properties and very good planarization. However, a low S/D ratio results in poor gap filling and step coverage, and indeed, it has been found that this provides air gaps between metal lines. The present invention takes advantage of these characteristics of the HDPCVD formation process to form a planar HDPCVD oxide layer that includes air gaps between metal lines. These air gaps reduce the capacitance between the metal lines, thereby improving the performance of the metal lines.

Figure 1:
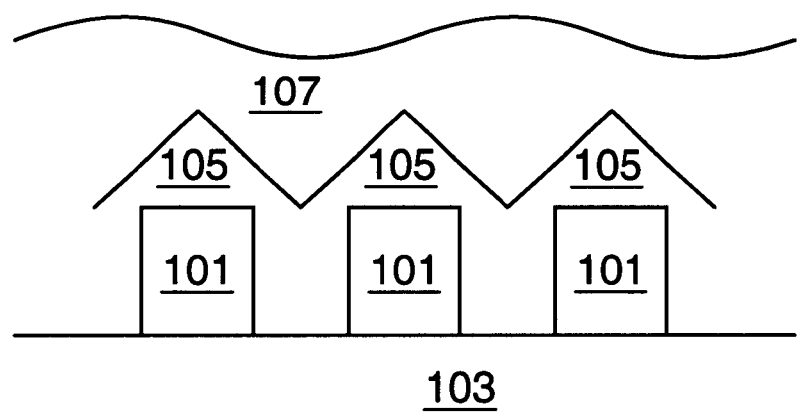
FIGS. 1 and 2 are cross-sectional views of a semiconductor substrate illustrating the prior art method of forming metal lines and an interlayer dielectric.
Figure 2:
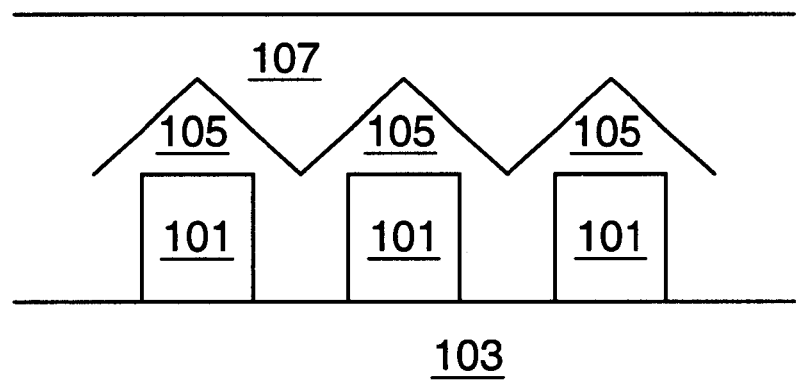
Figure 3:
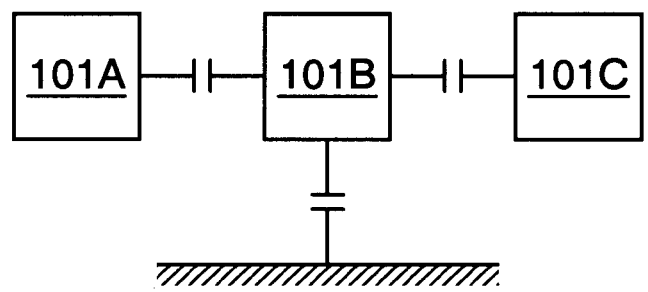
FIG. 3 is a schematic diagram showing a circuit representative of metal lines and an underlying substrate.
Figure 4:
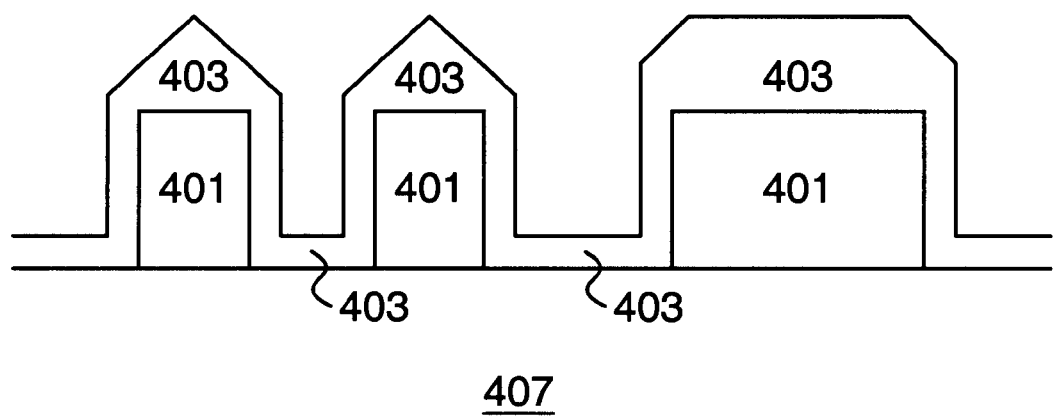
FIGS. 4–6 are cross-sectional views of a semiconductor substrate illustrating the method of the present invention.

Specifically, turning to FIG. 4, metal lines 401 are formed atop of a substrate 407. In accordance with the present invention, a first HDPCVD oxide deposition step is performed to deposit a first HDPCVD oxide 403. Importantly, the first HDPCVD oxide 403 is formed using a high S/D. Specifically, a S/D of about 0.25 may be used to form the first HDPCVD oxide 403. Preferably, the S/D in this step should be above 0.2.

The resulting HDPCVD oxide 403 exhibits very good step coverage over the metal lines 401. Preferably, the thickness of the HDPCVD oxide 403 is about 700 angstroms on the substrate 407 and about 200 angstroms on the sidewalls of the metal lines 401. The primary purpose of the HDPCVD oxide 403 is to control the size of the subsequently formed air gap in the next HDPCVD deposition step. By varying the thickness of the HDPCVD oxide 403, the size of the air gap can be controlled.

Figure 5:
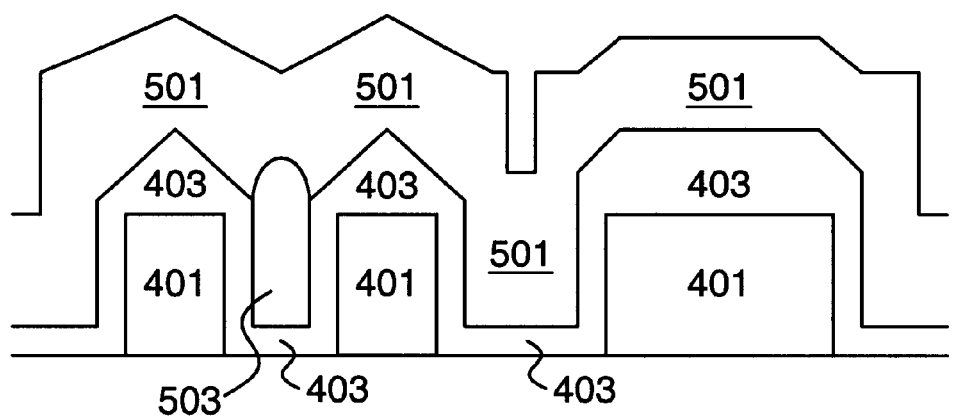

Next, turning to FIG. 5, a second HDPCVD oxide 501 is formed atop of the first HDPCVD oxide 403. In this second step, the S/D ratio is adjusted so that it is very low, preferably under 0.1, and more preferably around 0.0. This results in a second HDPCVD oxide 501 that has very poor step coverage, which results in the formation of an air gap 503 between metal lines 401 that are in close proximity to each other (for example about 0.17 microns apart or less). The air gap 503 has a lower dielectric constant than that of the HDPCVD oxide, and therefore, lower capacitance between metal lines 401 is provided. Preferably, the thickness of the second HDPCVD oxide 501 is about 3000 angstroms.

Figure 6:
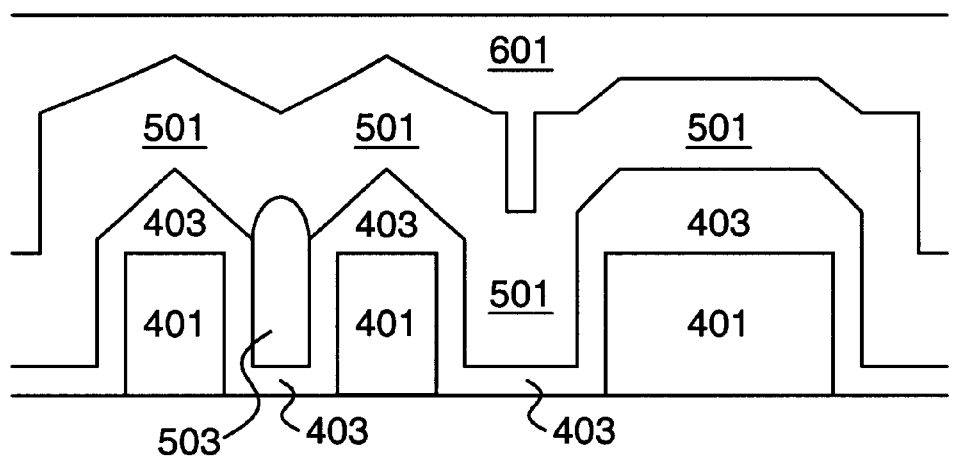

Finally, turning to FIG. 6, a third HDPCVD oxide 601 is deposited over the second HDPCVD oxide 501. In this third oxide formation step, the S/D ratio is adjusted so that it is very high, preferably greater than 0.4, and more preferably around 0.5 and higher. This results in an extremely planar oxide layer. Preferably, the thickness of the third HDPCVD oxide 601 is about 5000 angstroms. Note that each of the HDPCVD oxide deposition steps can be performed in the same process chamber. The parameters of deposition need only be changed. Further, optionally, a chemical mechanical polishing (CMP) step can be used to further planarize the third HDPCVD oxide 601.

In one actual embodiment performed on the model SPEED™ HDPCVD machine manufactured by Novellus, the following process parameters where used to achieve the above S/D ratios:

|  | S/D 0.25 | S/D 0.0 | S/D 0.5 |
| --- | --- | --- | --- |
| Low Frequency Power | 3500 watts | 3500 watts | 2500 watts |
| High Frequency Power | 3000 watts | 0 watts | 4000 watts |
| Argon Flow | 390 sccm | 390 sccm | 390 sccm |
| Oxygen Flow | 150 sccm | 200 sccm | 80 sccm |
| SiH$_4$ | 100 sccm | 100 sccm | 50 sccm |

While the preferred embodiment of the invention has been illustrated and described, it will be appreciated that various changes can be made therein without departing from the spirit and scope of the invention.

What is claimed is:

1. A method for forming a metal interconnect having a plurality of metal lines and an interlayer dielectric, the method comprising:

forming said metal interconnect onto a substrate;

forming a first oxide layer over said metal interconnect in a process chamber, said first dielectric layer having a thickness of about 700 angstroms using a high density plasma chemical vapor deposition (HDPCVD) process having a first sputter to deposition (S/D) ratio;

forming a second oxide layer in said process chamber over said first oxide layer, said second oxide layer being formed using an HDPCVD process having a second S/D ratio less than said first S/D ratio and such that air gaps are formed between the metal lines of said metal interconnect; and forming a third oxide layer in said process chamber over said second oxide layer resulting in a planar layer.

2. A method for forming a metal interconnect having a plurality of metal lines and an interlayer dielectric, the method comprising:

forming said metal interconnect onto a substrate;

forming a first high-density plasma chemical vapor deposition (HDPCVD) oxide layer in a process chamber over said metal interconnect, said first HDPCVD oxide layer formed using a first sputter to deposition (S/D) ratio and having a thickness of about 700 angstroms;

forming a second HDPCVD oxide layer in said process chamber over said first HDPCVD oxide layer, said second HDPCVD oxide being formed using a second S/D ratio less than said first S/D ratio and such that air gaps are formed between the metal lines of said metal interconnect.

3. The method of claim 2 further including the step of forming a third HDPCVD oxide layer over said second HDPCVD oxide layer, said third HDPCVD oxide formed using a third sputter to deposition (S/D) ratio higher than that used to form said second HDPCVD oxide layer.

4. The method of claim 3 wherein said second HDPCVD oxide layer is formed having a second S/D ratio of less than 0.1 and said third HDPCVD oxide layer has said S/D ratio of greater than 0.4.

\* \* \* \* \*